United States Patent
Fukami

(10) Patent No.: US 9,224,698 B1
(45) Date of Patent: Dec. 29, 2015

(54) SEMICONDUCTOR DEVICE

(71) Applicant: TOYOTA JIDOSHA KABUSHIKI KAISHA, Toyota-shi, Aichi-ken (JP)

(72) Inventor: Takeshi Fukami, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/687,224

(22) Filed: Apr. 15, 2015

(30) Foreign Application Priority Data

Jun. 9, 2014 (JP) .................................. 2014-118492

(51) Int. Cl.
| | | |
|---|---|---|
| *H01L 23/495* | (2006.01) | |
| *H01L 23/52* | (2006.01) | |
| *H01L 23/00* | (2006.01) | |
| *H01L 23/31* | (2006.01) | |

(52) U.S. Cl.
CPC .......... *H01L 23/562* (2013.01); *H01L 23/3157* (2013.01); *H01L 23/49513* (2013.01); *H01L 23/49541* (2013.01); *H01L 23/49586* (2013.01); *H01L 24/32* (2013.01); *H01L 2224/32245* (2013.01); *H01L 2924/07025* (2013.01)

(58) Field of Classification Search
CPC ..... H01L 24/32; H01L 24/85; H01L 23/3157; H01L 23/49513
USPC ................... 257/666, 750, 779, 783, E23.031
See application file for complete search history.

(56) References Cited

U.S. PATENT DOCUMENTS

| | | | | |
|---|---|---|---|---|
| 5,914,530 | A * | 6/1999 | Murakami .......... | H01L 23/3107 257/659 |
| 6,177,731 | B1 * | 1/2001 | Ishida .................... | H01L 21/563 257/772 |
| 6,852,567 | B1 * | 2/2005 | Lee ...................... | H01L 23/3142 257/666 |
| 2005/0029666 | A1 * | 2/2005 | Kurihara ............... | H01L 21/561 257/772 |
| 2008/0296764 | A1 * | 12/2008 | Chang .................... | H01L 24/11 257/738 |
| 2012/0153444 | A1 * | 6/2012 | Haga ................... | H01L 23/4334 257/666 |
| 2014/0090698 | A1 * | 4/2014 | Kumai .................... | H05K 3/20 136/251 |
| 2014/0217595 | A1 * | 8/2014 | Sakurai ................ | B23K 35/262 257/772 |
| 2014/0264383 | A1 * | 9/2014 | Kajiwara .............. | H01L 23/293 257/77 |
| 2015/0055302 | A1 | 2/2015 | Nagatomo et al. | |

FOREIGN PATENT DOCUMENTS

JP      2013-214561 A     10/2013

\* cited by examiner

*Primary Examiner* — Nitin Parekh
(74) *Attorney, Agent, or Firm* — Oliff PLC

(57) ABSTRACT

A semiconductor device 1 is provided with a semiconductor substrate 10, an electrode 30 formed on a surface of the semiconductor substrate 10, and an insulation film 20 formed on the electrode 30. The semiconductor device 1 includes a metal film 40 extending over a part of the surface of the electrode 30 not covered by the insulation film 20 and a surface of the insulation film 20. The semiconductor device 1 includes solder 80 formed on a surface of the metal film 40, a lead frame 50 joined to the metal film 40 by the solder 80, and sealing resin 60 sealing the insulation film 20, the metal film 40, and the solder 80. A convex 70 is formed on the surface of the insulation film 20. The metal film 40 covers the convex 70. The solder 80 covers the metal film 40 covering the convex 70.

3 Claims, 6 Drawing Sheets

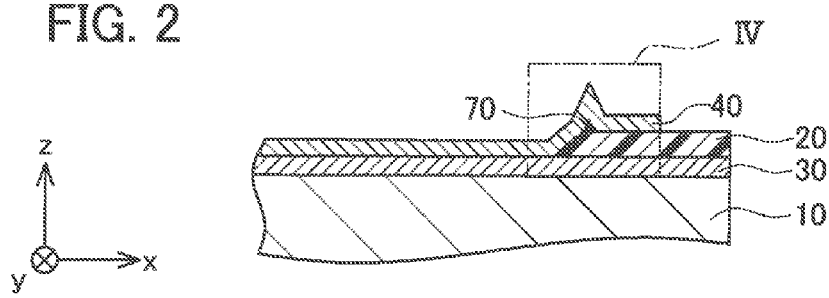
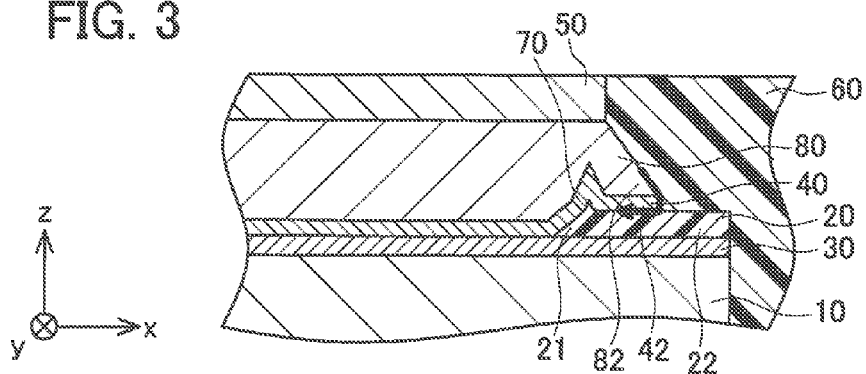
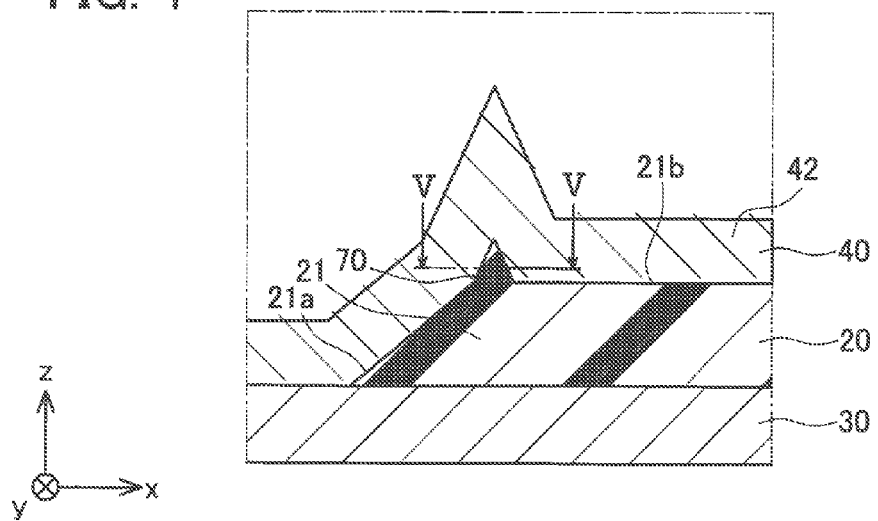

SEMICONDUCTOR DEVICE

CROSS-REFERENCE TO RELATED APPLICATION

This application claims priority to Japanese Patent Application No. 2014-118492 filed on Jun. 9, 2014, the contents of which are hereby incorporated by reference into the present application.

TECHNICAL FIELD

The present application relates to a semiconductor device.

DESCRIPTION OF RELATED ART

When current flows through and thus a temperature rises in a semiconductor device including a solder layer, a crack may occur in the solder layer due to stress. Japanese Patent Application Publication No. 2013-214561 (JP 2013-214561 A) discloses a technique of preventing the crack from occurring and developing in a solder layer in a semiconductor device. According to the technique disclosed in JP 2013-214561 A, the solder layer is composed of a solid-solubilized-hardening type solder material including Sn as a major component and solid-solubilized elements being solid-solubilized into this Sn.

The technique disclosed in JP 2013-214561 A prevents a crack from occurring and developing, with an effect of the material of the solder layer, but cannot sufficiently prevent the crack from developing after its occurrence.

BRIEF SUMMARY OF INVENTION

An object of the specification is to provide a semiconductor device that can prevent a crack from developing. A semiconductor device disclosed in this specification comprises a substrate including a semiconductor substrate, an insulation film formed on a surface of the substrate, a metal film extending over a part of the surface of the substrate not covered by the insulation film and a surface of the insulation film. The semiconductor device comprises solder formed on a surface of the metal film, a lead frame joined to the metal film by the solder, and sealing resin sealing the insulation film, the metal film, and the solder. A convex is formed on the surface of the insulation film. The metal film covers the convex. The solder covers the metal film covering the convex.

When current flows and thus a temperature rises in the semiconductor device including the sealing resin and the solder, a crack might occur at a boundary of the sealing resin and the solder, due to a difference between the sealing resin and the solder in thermal expansion coefficient. The crack that has occurred might develop toward an inner side and reach a boundary of the metal film and the insulation film. In an occurrence of such a crack, since the semiconductor device described above includes the insulation film having the convex protruding toward the metal film and the metal film covers the convex, the crack developing through the boundary of the metal film and the insulation film stops at the convex. This structure can prevent the crack from developing.

BRIEF DESCRIPTION OF DRAWINGS

FIG. 2 is a cross-sectional view taken along II-II in FIG. 1;
FIG. 3 is a cross-sectional view showing the same portion as FIG. 2;
FIG. 4 is an enlarged view of a main part IV in FIG. 2.

DETAILED DESCRIPTION OF INVENTION

Figure 1:
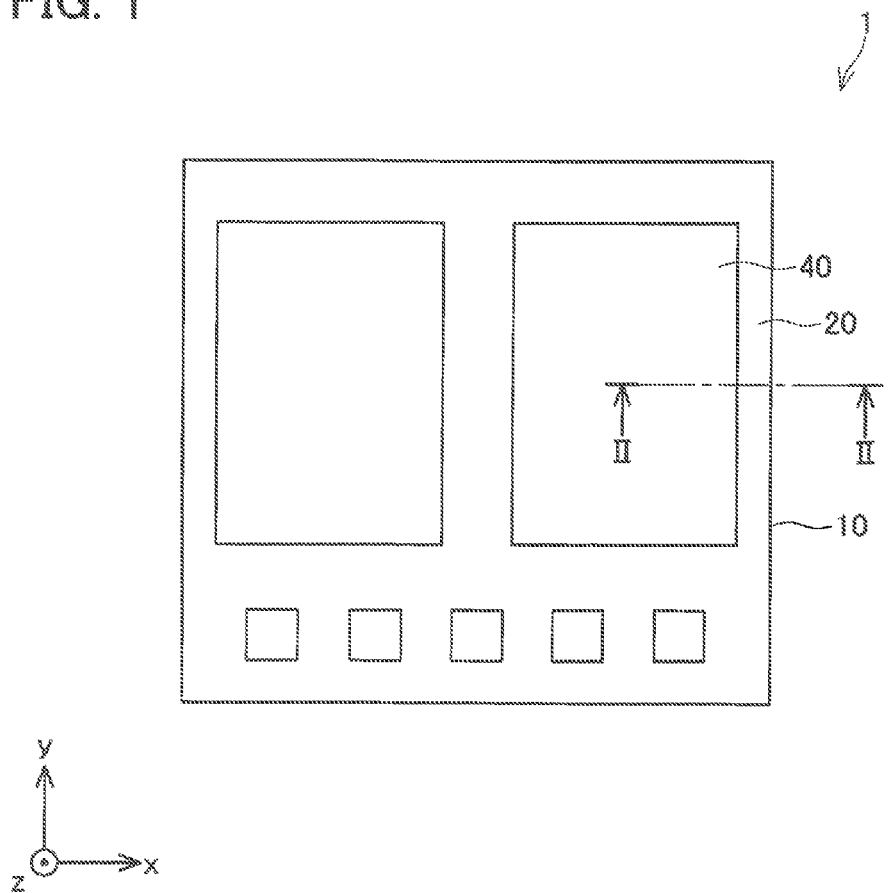
FIG. 1 is a plan view of a semiconductor device.

An embodiment will be described below with reference to the attached drawings. As illustrated in FIG. 1 and FIG. 2, a semiconductor device 1 includes a semiconductor substrate 10, an electrode 30 formed on a surface of the semiconductor substrate 10, an insulation film 20 formed on a surface of the electrode 30, and a metal film 40 formed on the surface of the electrode 30 and a surface of the insulation film 20. As illustrated in FIG. 3, the semiconductor device 1 further includes a lead frame 50 joined to the metal film 40 by solder 80 and sealing resin 60 sealing an entire structure. In FIG. 1 and FIG. 2, the solder 80, the lead flame 50, and the sealing resin 60 are omitted.

The semiconductor substrate 10 is made of silicon (Si). As other examples, the semiconductor substrate 10 may be made of silicon carbide (SiC), gallium nitride (GaN), and the like. A semiconductor element (not shown) is formed within the semiconductor substrate 10. An insulated gate bipolar transistor (IGBT) is exemplified as the semiconductor element. Alternatively, the semiconductor element may be, for example, a free wheeling diode (FWD) or a metal oxide semiconductor field effect transistor (MOSFET).

The electrode 30 is made of aluminum silicon (AlSi). As another example, the electrode 30 may be formed of aluminum (Al). The electrode 30 is formed to have a film shape. The electrode 30 is formed on the semiconductor element (not shown). The electrode 30 is conductive. The electrode 30 is disposed on the surface of the semiconductor substrate 10 and is conducted to the semiconductor substrate 10. The insulation film 20 is formed on a surface of a substrate including the semiconductor substrate 10 and the electrode 30.

The insulation film 20 is formed above the semiconductor substrate 10. The insulation film 20 is disposed on the surface of the electrode 30. The insulation film 20 covers a part of the surface of the electrode 30. The insulation film 20 is made of resin. The insulation film 20 is made of polyimide. The insulation film 20 is not likely to form an alloy with the solder 80, and is not likely to be joined to the solder 80. The insulation film 20 includes an inner end 21 and an outer end 22. The insulation film 20 includes a convex 70. The convex 70 is formed on the surface of the insulation film 20.

The metal film 40 is made of a material that is likely to form an alloy with the solder 80. The metal film 40 is made of nickel (Ni). As another example, the metal film 40 may be formed of copper (Cu). The metal film 40 is formed by sputtering or plating. The metal film 40 covers the electrode 30 and the insulation film 20. The metal film 40 is formed so as to extend over a part of the surface of the electrode 30 not covered by the insulation film 20 and over at least a part of the surface of the insulation film 20. The metal film 40 covers the inner end 21 of the insulation film 20. The metal film 40 does not cover the outer end 22 of the insulation film 20. The metal film 40 covers an area extending from the inner end 21 of the insulation film 20 to an outer location than the center between the inner end 21 and the outer end 22. An outer end 42 of the metal film 40 is positioned on the insulation film 20. The metal film 40 covers the convex 70.

Figure 5:
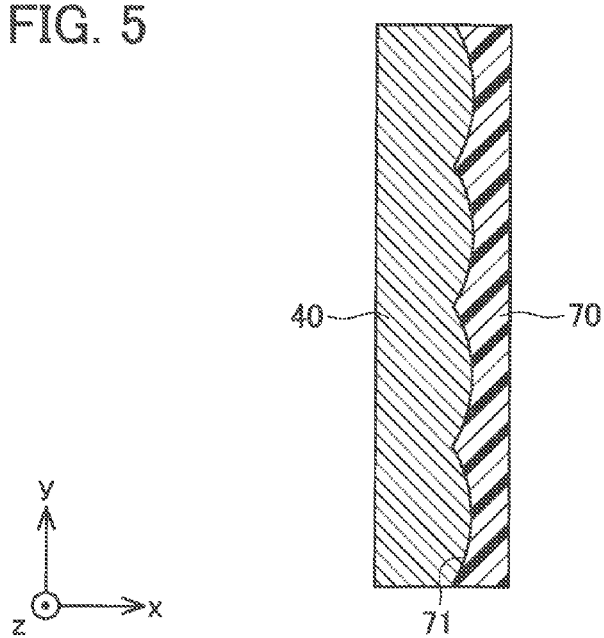
FIG. 5 is a cross-sectional view taken along V-V in FIG. 4.

As illustrated in FIG. 4, the convex 70 is formed at the inner end 21 of the insulation film 20. The convex 70 is formed at an upper portion of the insulation film 20. The convex 70 is formed at a ridge portion of the insulation film 20 (being a boundary portion between an edge surface 21a and a surface 21b of the insulation film 20 shown in FIG. 4). The convex 70 protrudes upward. The convex 70 protrudes toward the metal film 40. The convex 70 has a pointy end. The convex 70 bites into the metal film 40. As illustrated in FIG. 5, a boundary surface 71 between the convex 70 and the metal film 40 is curved in a plan view.

For example, the solder 80 is made of an alloy mainly composed of tin (Sn), silver (Ag), and copper (Cu). The solder 80 covers the metal film 40. The solder 80 is joined to the metal film 40. An outer end 82 of the solder 80 is positioned on the metal film 40. The outer end 82 of the solder 80 overlaps the outer end 42 of the metal film 40. The solder 80 covers the metal film 40 (the metal film 40 covering the convex 70) positioned on the convex 70. The solder 80 is filled between the metal film 40 and the lead flame 50. The solder 80 joins the metal film 40 to the lead frame 50.

The lead frame 50 is disposed above the metal film 40. The lead frame 50 is a metal member of copper (Cu) for example. The lead frame 50 is electrically connected to an external circuit (not shown).

The sealing resin 60 is made of epoxy for example. The sealing resin 60 is filled in a periphery of the semiconductor substrate 10, the insulation film 20, the metal film 40, the solder 80, and the lead frame 50. The sealing resin 60 covers the outer end 82 of the solder 80, the outer end 42 of the metal film 40, and the outer end 22 of the insulation film 20. A thermal expansion coefficient of the sealing resin 60 differs from a thermal expansion coefficient of the solder 80.

Figure 6:
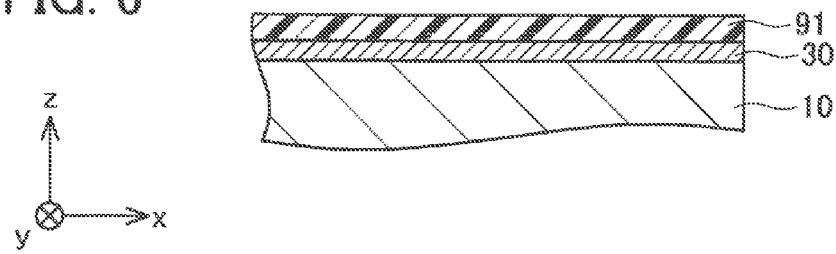
FIG. 6 is a diagram illustrating a method for manufacturing the semiconductor device (1)
Figure 7:
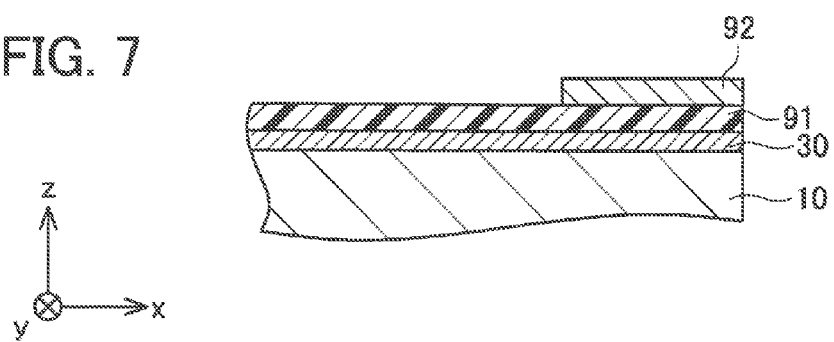
FIG. 7 is a diagram illustrating the method for manufacturing the semiconductor device (2)

Next, a method for manufacturing a semiconductor device is described. To manufacture a semiconductor device 1, first, the electrode 30 is formed on the semiconductor substrate 10 as illustrated in FIG. 6. A resin thin film 91 is formed on the surface of the electrode 30. The thin film 91 is made of polyimide. The thin film 91 is insulative. Next, a resist 92 is formed on a surface of the thin film 91 as illustrated in FIG. 7. The resist 92 is formed in an area where the insulation film 20 is to be formed.

Figure 8:
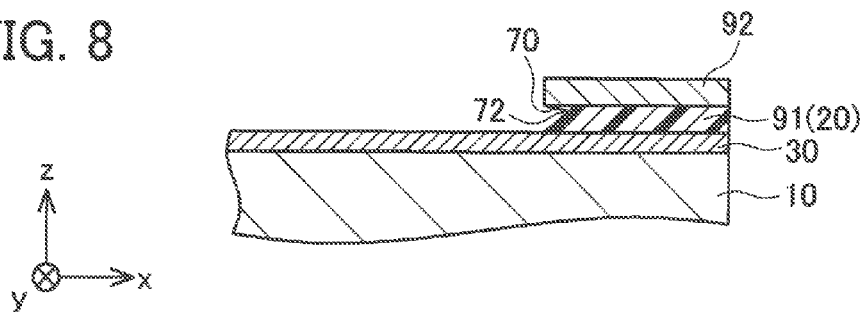
FIG. 8 is a diagram illustrating the method for manufacturing the semiconductor device (3)

Next, the thin film 91 is etched as illustrated in FIG. 8. Thus, the thin film 91 not covered by the resist 92, is etched. A part of the thin film 91 on which the resist 92 is not formed is removed by the etching, and a part of the thin film 91 on which the resist 92 is formed remains. The insulation film 20 is formed of the remaining thin film 91. A recess 72 is formed in the thin film 91 by the etching, with a part of the thin film 91 positioned under the resist 92 having been removed by the etching. A portion (70) of the thin film 91 which is joined to a rear surface of the resist 92 is not likely to dissolve during the etching. Thus, the portion (70) where the resist 92 is joined to the thin film 91 is not etched and thus remains.

Figure 9:
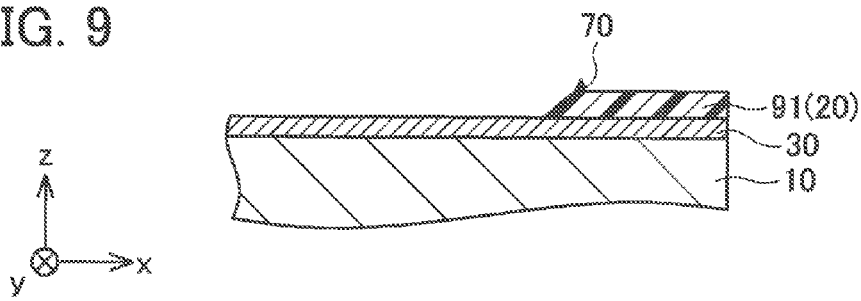
FIG. 9 is a diagram illustrating the method for manufacturing the semiconductor device (4)

Next, the resist 92 is removed off from the thin film 91 as illustrated in FIG. 9. Subsequently, heat treatment is performed. When the thin film 91 (the insulation film 20) is heated, the remaining portion (70) contracts due to heat, and thus forms a peak upward. Thus, the convex 70 protruding upward is formed. The convex 70 is formed on the inner end 21 of the insulation film 20. The convex 70 is formed at the ridge portion of the insulation film 20.

Figure 10:
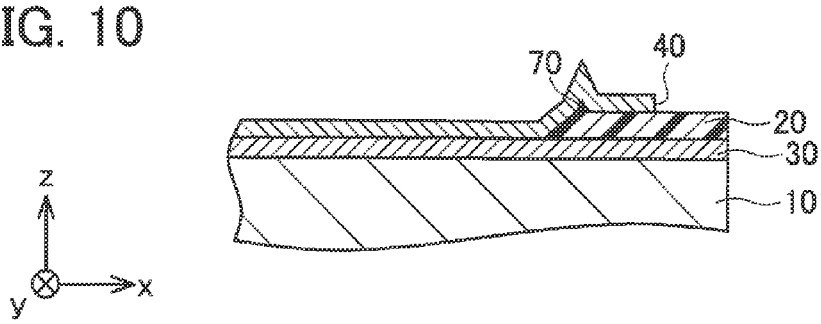
FIG. 10 is a diagram illustrating the method for manufacturing the semiconductor device (5)
Figure 11:
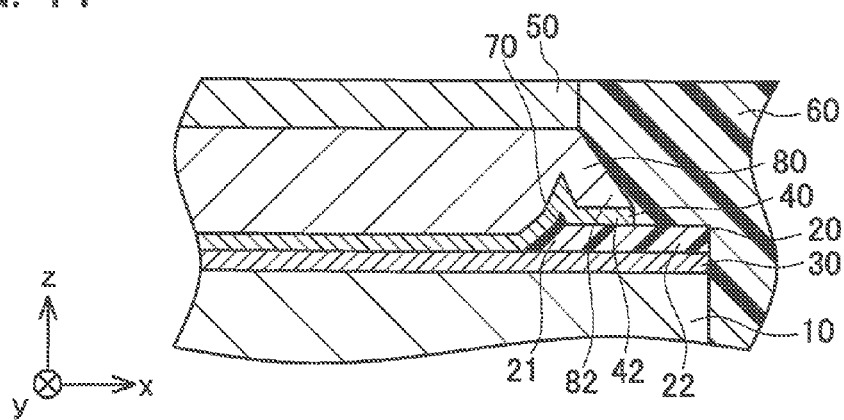
FIG. 11 is a diagram illustrating the method for manufacturing the semiconductor device (6)

Next, the metal film 40 is formed on the electrode 30 and the insulation film 20 as illustrated in FIG. 10. The metal film 40 covers the convex 70. The metal film 40 is formed so as to extend over a part of the surface of the electrode 30 not covered by the insulation film 20 and over a part of the surface of the insulation film 20. Next, the lead frame 50 is joined to the metal film 40 by the solder 80 as illustrated in FIG. 11. The solder 80 is disposed to cover the metal film 40 covering the convex 70. Then, the semiconductor substrate 10, the electrode 30, the insulation film 20, the metal film 40, and the solder 80 are sealed by the sealing resin 60. The semiconductor device 1 can be manufactured as described above.

When current flows through and heat is produced in the semiconductor device 1 described above, a crack might occur at the boundary of the sealing resin 60 and the solder 80 due to the difference between the sealing resin 60 and the solder 80 in the thermal expansion coefficients. The crack develops from the boundary of the sealing resin 60 and the solder 80 to the boundary of the sealing resin 60 and the metal film 40 and to the boundary of the metal film 40 and the insulation film 20, as indicated by an arrow in FIG. 3. At this occasion, the semiconductor device 1 described above includes the insulation film 20 having the convex 70 protruding toward the metal film 40 and the metal film 40 covers the convex 70. Thus, the crack developing through the boundary of the metal film 40 and the insulation film 20 is stopped by the convex 70. Thus, the semiconductor device 1 described above can prevent the crack from developing.

Further, the insulation film 20 is made of polyimide and the convex 70 is formed at the ridge portion of the insulation film 20. With this configuration, the convex 70 can be formed in the insulation film 20 through the etching and the heat treatment, and thus can be easily formed.

One embodiment is described above, and a specific mode is not limited to the embodiment described above. For example, the specific mode is not limited to the configuration in which the electrode 30 is formed under the insulation film 20 as in the embodiment described above. As another embodiment, the electrode 30 may not be formed under the insulation film 20, and the insulation film 20 may be formed on the semiconductor substrate 10. That is, the insulation film 20 may be formed on the surface of the semiconductor substrate 10. The semiconductor substrate 10 corresponds to a substrate on which the insulation film 20 is formed.

Figure 12:
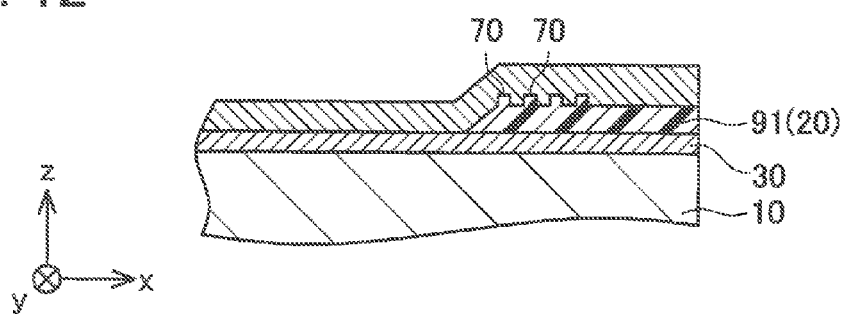
FIG. 12 is a cross-sectional view of a main part in a semiconductor device according to another embodiment.

The number of convexes 70 formed on the insulation film 20 is not particularly limited, and a plurality of convexes 70 may be formed on the insulation film 20 as illustrated in FIG. 12. The plurality of convexes 70 is formed with intervals provided between one another. Further, a shape of the convex 70 is not particularly limited.

Figure 13:
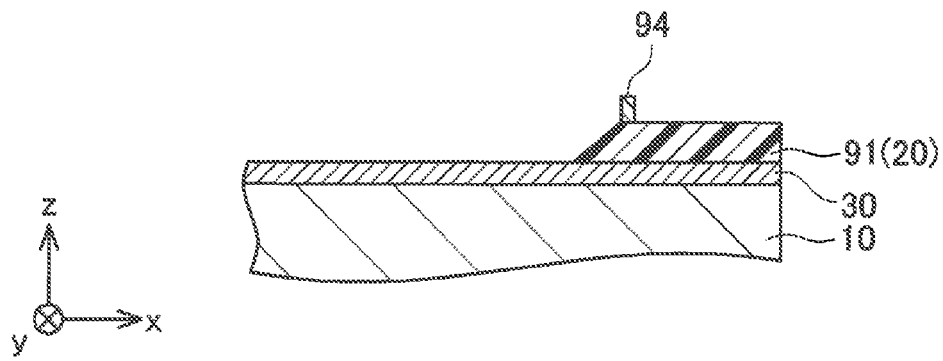
FIG. 13 is a diagram illustrating a method for manufacturing the semiconductor device according to the other embodiment (1)
Figure 14:
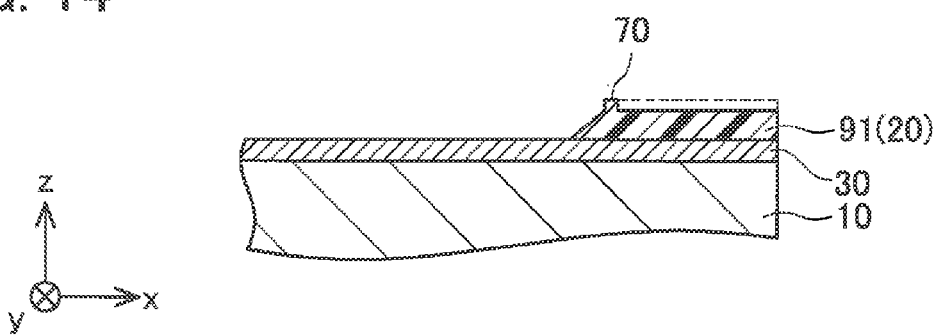
FIG. 14 is a diagram illustrating the method for manufacturing the semiconductor device according to the other embodiment (2).

A method for forming the convex 70 is not particularly limited. For example, as illustrated in FIG. 13 and FIG. 14, a resist 94 may be formed on the thin film 91 (the insulation film 20) and the convex 70 may be formed by etching the thin film 91 (the insulation film 20).

While specific examples of the present invention have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those objectives gives technical utility to the present invention.

Some of other features of the present disclosure will be listed below. It should be noted that each of the features listed below is independently useful.

1. The insulation film may be made of polyimide. The convex may be formed at a ridge portion of the insulation film.

2. The substrate may comprise an electrode formed on a surface of the semiconductor substrate.

3. The convex may be formed on a boundary of an edge surface and the surface of the insulation film.

4. A method for manufacturing a semiconductor device may include forming an insulating thin film on a surface of a substrate including a semiconductor substrate; forming a resist on a surface of the thin film; etching a part of the thin film not covered by the resist; and then by heat treating the thin film, forming an insulation film on the surface of the substrate and forming a convex at a ridge portion of the insulation film. The method for manufacturing the semiconductor device may further include forming a metal film extending over a part of the surface of the substrate not covered by the insulation film and a surface of the insulation film, in which the metal film is formed so as to cover the convex.

The method for manufacturing the semiconductor device may further include disposing solder so as to cover the metal film covering the convex and joining a lead frame to the metal film by the solder. The method for manufacturing the semiconductor device may further include forming sealing resin sealing the insulation film, the metal film, and the solder.

What is claimed is:

1. A semiconductor device comprising:
a substrate including a semiconductor substrate; an electrode formed on a surface of the semiconductor substrate;
an insulation film formed on a part of a surface of the electrode;
a metal film extending over a part of a surface of the electrode not covered by the insulation film and over a boundary portion of the insulation film;
a solder formed on a surface of the metal film;
a lead frame directly joined to the metal film by the solder; and
sealing resin sealing the insulation film, the metal film, and the solder,
wherein a convex is formed on the boundary portion of the insulation film, the convex having a peak at a ridge of the boundary portion of the insulation film,
the metal film covering the convex, and
the solder covering the metal film covering the convex.

2. The semiconductor device according to claim 1, wherein the insulation film is made of polyimide.

3. The semiconductor device according to claim 1, wherein the convex is formed on the boundary portion at an edge surface of the insulation film.

* * * * *